United States Patent [19]

Adhihetty et al.

[11] Patent Number: 5,510,649
[45] Date of Patent: Apr. 23, 1996

[54] CERAMIC SEMICONDUCTOR PACKAGE HAVING VARYING CONDUCTIVE BONDS

[75] Inventors: Indira Adhihetty, Tempe; Brian J. Miller, Chandler; Ramaswamy Padmanabhan, Mesa, all of Ariz.

[73] Assignee: Motorola, Inc., Schaumburg, Ill.

[21] Appl. No.: 229,263

[22] Filed: Apr. 18, 1994

Related U.S. Application Data

[63] Continuation-in-part of Ser. No. 884,815, May 18, 1992, abandoned.

[51] Int. Cl.⁶ .......................... H01L 39/02; H01L 23/02; H05K 7/02
[52] U.S. Cl. .......................... 257/675; 257/666; 257/668; 257/705; 257/706; 257/707; 257/712; 257/713; 257/717; 361/723
[58] Field of Search .................................. 257/666, 667, 257/701, 703, 704, 705, 706, 707, 712, 713, 717, 718, 719, 722, 675, 678; 361/723

[56] References Cited

U.S. PATENT DOCUMENTS

| 4,535,350 | 8/1985 | Goodrich et al. | 257/704 |
| 4,651,192 | 3/1987 | Matsushita et al. | 257/706 |
| 5,057,905 | 10/1991 | Matsumoto et al. | 257/701 |

Primary Examiner—Sara W. Crane
Assistant Examiner—Carl Whitehead, Jr.
Attorney, Agent, or Firm—Miriam Jackson

[57] ABSTRACT

A semiconductor chip package is manufactured comprising a heatsink bonded to an aluminum nitride insulative layer by a thermally conductive and electrically nonconductive epoxy. The aluminum nitride insulative layer is bonded to several portions of a leadframe by an epoxy which is thermally conductive and electrically nonconductive and another epoxy which is thermally conductive and electrically conductive. A semiconductor die is bonded to the aluminum nitride insulative layer by a thermally conductive and electrically conductive epoxy.

25 Claims, 1 Drawing Sheet

CERAMIC SEMICONDUCTOR PACKAGE HAVING VARYING CONDUCTIVE BONDS

This application is a continuation-in-part of prior application Ser. No. 07/884,815, filed on May 18, 1992 now abandoned.

BACKGROUND OF THE INVENTION

This invention relates, in general, to a semiconductor chip package, including, but not limited to, a semiconductor chip package for high power chips which does not use beryllium oxide.

A semiconductor chip package for high power semiconductor chips used in the past is comprised of a heatsink, an insulative layer comprised of beryllium oxide (BeO) disposed on the heatsink, and a semiconductor chip and a gold leadframe disposed on the insulative layer. The BeO acts to dissipate the heat generated by the high power semiconductor chip.

This package does provide for good reliability and adhesion. However, the problem is that BeO is a carcinogen that must be eliminated to comply with OSHA standards.

Therefore, it would be desirable to come up with a new package design which provides for good reliability, heat dissipation, and adhesion.

SUMMARY OF THE INVENTION

A package for housing a semiconductor chip is manufactured comprising a heatsink comprised of copper, and a first epoxy which is thermally conductive and electrically nonconductive chemically bonded to a portion of the heatsink. An insulative layer is chemically bonded to the first epoxy. A second epoxy which is thermally conductive and electrically conductive is chemically bonded to a first portion of the insulative layer. A third epoxy which is thermally conductive and electrically nonconductive is chemically bonded to a second portion of the insulative layer. Separate portions of a leadframe comprised of copper are chemically bonded to the second epoxy and the third epoxy.

Thereafter, a semiconductor chip may be bonded to the package. First, a fourth epoxy which is thermally conductive and electrically conductive is chemically bonded to a third portion of the insulative layer and then the semiconductor chip is chemically bonded to the fourth epoxy.

DETAILED DESCRIPTION OF THE DRAWING

Figure 1:
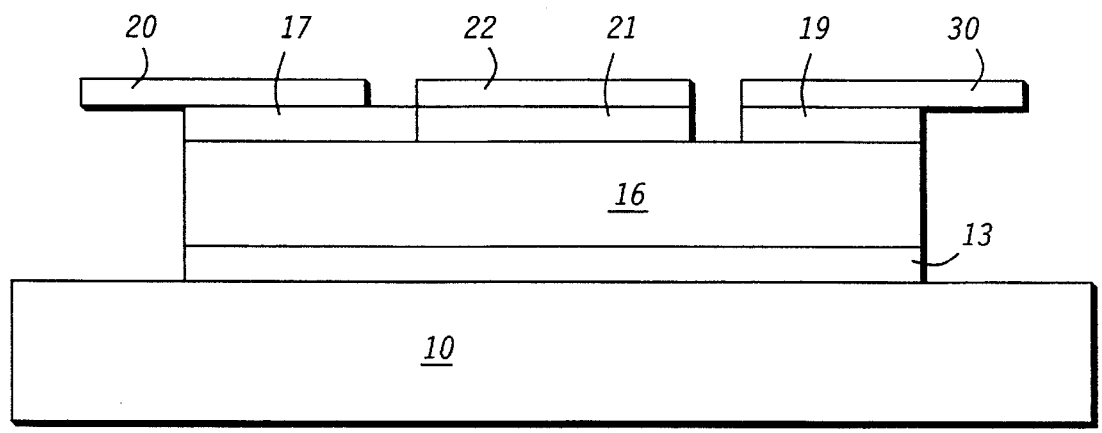
FIG. 1 illustrates an enlarged, cross-sectional view of an embodiment of the present invention.

FIG. 1 illustrates an embodiment, a package design, of the present invention. What is shown is a heatsink 10 comprised of copper. Heatsink 10 provides dissipation of heat generated by operation of a semiconductor chip 22. A first epoxy 13 which is thermally conductive and electrically nonconductive is disposed on a portion of heatsink 10. In a preferred embodiment, first epoxy 13 is comprised of a silica filled epoxy manufactured by Sumitomo, which is approximately greater than or equal to 75% silica. First epoxy 13 can be formed on heatsink 10 by hand application or screen printing. Presently, first epoxy 13 is provided in liquid form; however, it is possible that it could be available in a more solid form, i.e., sheet layers of first epoxy 13 in a desired thickness. Other suitable methods may be used. In a production process, screen printing is preferred for its ease of manufacturability.

First epoxy 13 provides for low cost and reliable bonding of heatsink 10 to an insulative layer 16. Insulative layer 16 is preferably comprised of aluminum nitride, however, other insulative materials may be used. Insulative layer 16 is disposed on first epoxy 13. Insulative layer 16 of the present invention insulates semiconductor chip 22 from heatsink 10 and provides for good heat dissipation to heatsink 10. First epoxy 13, being thermally conductive, also provides for good heat dissipation to heatsink 10. The package design of the present invention eliminates the need for using BeO. Aluminum nitride is also not a carcinogen. Therefore, the package design of the present invention is obviously more environmentally safe than that used in the prior art.

A second epoxy 17 which is thermally conductive and electrically conductive is disposed on a first portion of insulative layer 16. In a preferred embodiment, second epoxy 17 is comprised of a silver filled epoxy also available from Sumitomo, which is approximately 70–80% silver filled. A third epoxy 19 which is thermally conductive and electrically nonconductive is disposed on a second portion of insulative layer 16. Third epoxy 19 is the same as first epoxy 13.

Second epoxy 17 and third epoxy 19 provide for low cost and reliable bonding of insulative layer 16 to a leadframe separated into leadframe portion 20 and leadframe portion 30. The separation of the leadframe is well known in the art. In the present invention, the leadframe may be comprised of copper. In the prior art, a gold leadframe was used, which costs a lot more than one comprised of copper. Leadframe portion 20 which can be electrically connected to another portion of the leadframe or semiconductor chip 22 is disposed on second epoxy 17 (see FIG. 2 for top view). Leadframe portion 30, which is physically and electrically isolated from leadframe portion 20, is disposed on third epoxy 19.

Semiconductor chip 22 may now be bonded to insulative layer 16. A fourth epoxy 21 which is thermally conductive and electrically conductive is disposed on a third portion of insulative layer 16. Fourth epoxy 21 is the same as second epoxy 17. Semiconductor chip 22 is preferably comprised of silicon at the bonding interface. Other semiconductor materials may also be bonded to insulative layer 16 with fourth epoxy 21.

Figure 2:
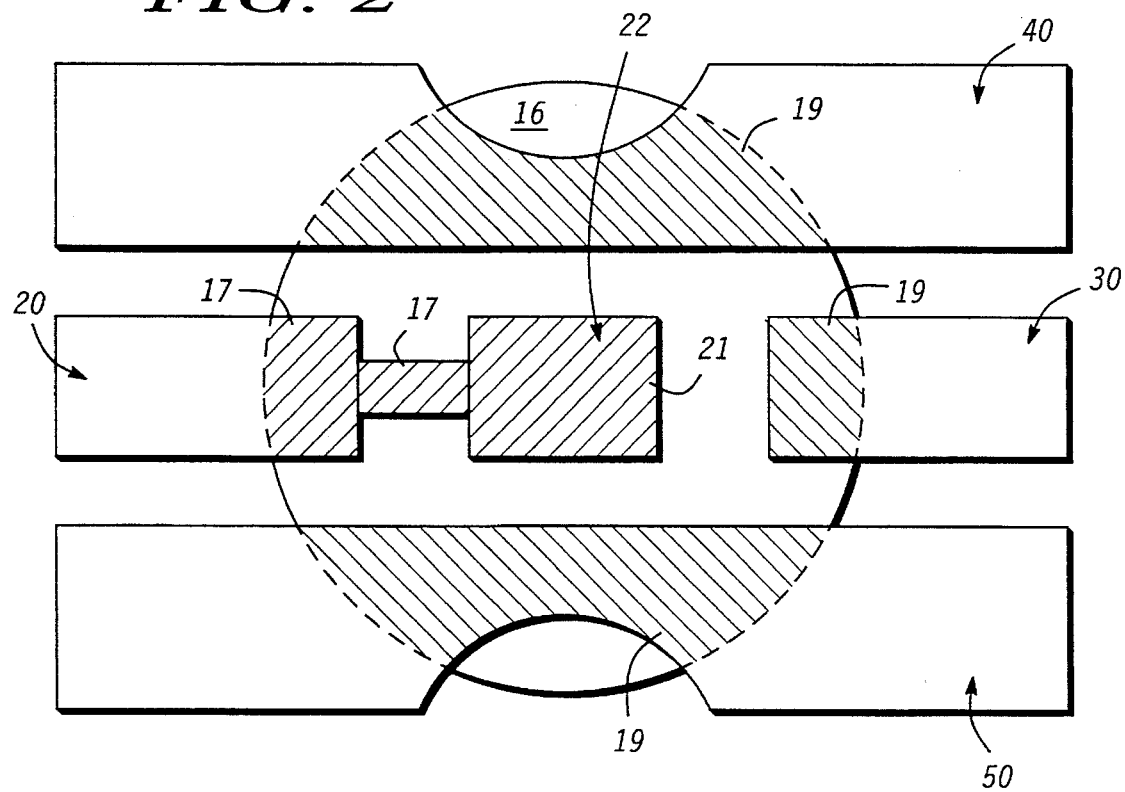
FIG. 2 illustrates a top view of an embodiment of the present invention.

FIG. 2 better illustrates how second epoxy 17 and third epoxy 19 may be bonded to portions of a leadframe. In this embodiment, leadframe portion 20 is the base, leadframe portion 30 is the collector, leadframe portions 40 and 50 are the emitters. In this embodiment, a physically separate leadframe portion 20 is electrically connected to semiconductor chip 22 through second epoxy 17 (which is the same as fourth epoxy 21).

In the package design of the present invention, a chemical, rather than a mechanical or physical bond, is formed at the interfaces between 1) heatsink 10/first epoxy 13; 2) first epoxy 13/insulative layer 16; 3) second, third and fourth epoxy 17, 19 and 21/insulative layer 16; 4) second and third epoxy 17 and 19/leadframe 20; and 5) fourth epoxy 21/semiconductor chip 22 upon heat treatment. First, second, third, and fourth epoxies 13, 17, 19, and 21 (hereinafter, the epoxies) are basically composed of

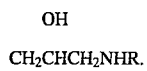

In the reaction between the appropriate epoxies and heatsink 10 or leadframe 20, the copper reacts with the epoxy to form $CH_2CHCH_2NHR.OCu$. In the reaction between the epoxies and insulative layer 16, the aluminum-nitride reacts with the epoxies to form $CH_2CHCH_2NHR.O_3Al_2$. The reaction between fourth epoxy 21 and semiconductor chip 22 forms $CH_2CHCH_2NHR.OSi$. These are all strong oxide chemical bonds that provide excellent adhesion properties.

In a preferred embodiment, the complete package, including semiconductor chip 22, is exposed to a temperature of approximately 200° C. for approximately one hour to cure first, second, third, and fourth epoxies 13, 17, 19, and 21 and form the chemical bond. If the package, without semiconductor chip 22, is provided, then the heat treatment is the same, but must be repeated when semiconductor chip 22 is bonded to insulative layer 16. In the prior art which used BeO, a high temperature of 800° C. was used in the heat treatment. A lower temperature, such as 200° C. is more desirable because of reduction in thermally induced stress and associated problems with this stress.

The above heat treatment works well with first, second, third, and fourth epoxies 13, 17, 19, and 21 having a thickness approximately 10–125 microns. It is preferable that they be approximately 25 microns in thickness, because the thicker they get, the less heat transfer will take place. In addition, if they get too thin, problems with strength will result in reliability problems, such as cracking and popping because a stress buffer would not be provided.

As can be readily seen, the present invention allows for a low cost, low temperature, reliable package design for high power semiconductor chips. The use of thermally conductive, electrically conductive, and electrically nonconductive epoxies allow for a semiconductor chip package to be manufactured without the use of beryllium oxide, which is a carcinogen.

We claim:

1. A package for housing a semiconductor chip, comprised of:
   a heatsink comprised of copper;
   a first epoxy which is thermally conductive and electrically nonconductive chemically bonded to a portion of the heatsink;
   an insulative layer chemically bonded to the first epoxy;
   a second epoxy which is thermally conductive and electrically conductive chemically bonded to a first portion of the insulative layer;
   a third epoxy which is thermally conductive and electrically nonconductive chemically bonded to a second portion of the insulative layer; and
   a leadframe comprised of copper physically separated into at least a first and a second portion, wherein the first portion of the leadframe is chemically bonded to the second epoxy and the second portion of the leadframe is chemically bonded to the third epoxy.

2. The package of claim 1 further comprising:
   a fourth epoxy which is thermally conductive and electrically conductive chemically bonded to a third portion of the insulative layer; and
   a semiconductor chip chemically bonded to the fourth epoxy.

3. The package of claim 1 wherein the first epoxy and the third epoxy are comprised of a silica filled epoxy.

4. The package of claim 1 wherein the second epoxy is comprised of a silver filled epoxy.

5. The package of claim 2 wherein the fourth epoxy is comprised of a silver filled epoxy.

6. The package of claim 3 wherein the first epoxy and the third epoxy are comprised of a silica filled epoxy which is approximately greater than or equal to 75% silica.

7. The package of claim 4 wherein the second epoxy is comprised of a silver filled epoxy which is approximately 70–80% silver.

8. The package of claim 5 wherein the fourth epoxy is comprised of a silver filled epoxy which is approximately 70–80% silver.

9. The package of claim 1 wherein the insulative layer is comprised of aluminum nitride.

10. The package of claim 1 wherein the first, second, and third epoxy are approximately 10–125 microns thick.

11. The package of claim 2 wherein the fourth epoxy is approximately 10–125 microns thick.

12. A package for housing a semiconductor chip, comprised of:
   a heatsink comprised of copper;
   a first silica filled epoxy which is thermally conductive and electrically nonconductive chemically bonded to a portion of the heatsink;
   an insulative layer chemically bonded to the first epoxy;
   a first silver filled epoxy which is thermally conductive and electrically conductive chemically bonded to a first portion of the insulative layer;
   a second silica filled epoxy which is thermally conductive and electrically nonconductive chemically bonded to a second portion of the insulative layer; and
   a leadframe comprised of copper physically separated into at least a first and a second portion, wherein the first portion of the leadframe is chemically bonded to the first silver filled epoxy and the second portion of the leadframe is chemically bonded to the second silica filled epoxy.

13. The package of claim 12 further comprising:
   a second silver filled epoxy which is thermally conductive and electrically conductive chemically bonded to a third portion of the insulative layer; and
   a semiconductor chip chemically bonded to the second silver filled epoxy.

14. The package of claim 12 wherein the first silica filled epoxy and the second silica filled epoxy are comprised of a silica filled epoxy which is approximately greater than or equal to 75% silica.

15. The package of claim 12 wherein the first silver filled epoxy is comprised of a silver filled epoxy which is approximately 70–80% silver.

16. The package of claim 13 wherein the second silver filled epoxy is comprised of a silver filled epoxy which is approximately 70–80% silver.

17. The package of claim 12 wherein the insulative layer is comprised of aluminum nitride.

18. The package of claim 12 wherein the first and the second silica filled epoxy and the first silver filled epoxy are approximately 10–125 microns thick.

19. The package of claim 13 wherein the second silver filled epoxy is approximately 10–125 microns thick.

20. A package for housing a semiconductor chip, comprised of:
   a heatsink comprised of copper;
   a first epoxy which is thermally conductive and electrically nonconductive chemically bonded to a portion of the heatsink through a first oxide bond;

an insulative layer comprised of aluminum-nitride chemically bonded to the first epoxy through a second oxide bond;

a second epoxy which is thermally conductive and electrically conductive chemically bonded to a first portion of the insulative layer through a third oxide bond;

a third epoxy which is thermally conductive and electrically nonconductive chemically bonded to a second portion of the insulative layer through a fourth oxide bond; and a leadframe comprised of copper physically separated into at least a first and a second portion, wherein the first portion of the leadframe is chemically bonded to the second epoxy through a fifth oxide bond and the second portion of the leadframe is chemically bonded to the third epoxy through a sixth oxide bond.

21. The package of claim 20 further comprising:

a fourth epoxy which is thermally conductive and electrically conductive chemically bonded to a third portion of the insulative layer through a seventh oxide bond; and a semiconductor chip chemically bonded to the fourth epoxy through an eight oxide bond.

22. The package of claim 20 wherein the first epoxy and the third epoxy are comprised of a silica filled epoxy and the first and the sixth oxide bonds are comprised of $CH_2CHCH_2NHR.OCu$ and the second and the fourth oxide bonds are comprised of $CH_2CHCH_2NHR.O_3Al_2$.

23. The package of claim 20 wherein the second epoxy is comprised of a silver filled epoxy and the third oxide bond is comprised of $CH_2CHCH_2NHR.O_3Al_2$ and the fifth oxide bond is comprised of $CH_2CHCH_2NHR.OCu$.

24. The package of claim 21 wherein the fourth epoxy is comprised of a silver filled epoxy and the seventh oxide bond is comprised of $CH_2CHCH_2NHR.O_3Al_2$.

25. The package of claim 21 wherein the semiconductor chip is comprised of silicon and the eighth oxide bond is comprised of $CH_2CHCH_2NHR.OSi$.

* * * * *